United States Patent [19]

Macovski

[11] Patent Number: 4,521,734
[45] Date of Patent: Jun. 4, 1985

[54] PULSED MAIN FIELD NUCLEAR MAGNETIC RESONANCE IMAGING SYSTEM

[76] Inventor: Albert Macovski, 2505 Alpine Rd., Menlo Park, Calif. 94025

[21] Appl. No.: 457,589

[22] Filed: Jan. 13, 1983

[51] Int. Cl.³ .............................................. G01R 33/08
[52] U.S. Cl. ...................................... 324/313; 324/311
[58] Field of Search ............... 324/300, 307, 311, 313, 324/309

[56] References Cited

U.S. PATENT DOCUMENTS 3,714,551  1/1973  Pajak .................................... 324/313
3,774,103  11/1973 Laukien ............................... 324/313

Primary Examiner—Michael J. Tokar
Attorney, Agent, or Firm—Flehr, Hohbach, Test, Albritton & Herbert

[57] ABSTRACT

The electromagnet providing the main field of the nuclear magnetic resonance (nmr) imaging system is turned up during the data acquisition region and turned down between data acquisition periods. The data acquisition consists of the excitation of the spins and the reception of the associated signals.

12 Claims, 1 Drawing Figure

PULSED MAIN FIELD NUCLEAR MAGNETIC RESONANCE IMAGING SYSTEM

BACKGROUND OF THE INVENTION

1. Field of the Invention

This invention relates to medical imaging systems using nuclear magnetic resonance. In a primary application the invention relates to providing nmr images at lower cost with improved signal-to-noise ratio.

2. Description of Prior Art

Nuclear magnetic resonance or nmr imaging has recently become commercially available and is being enthusiastically received because of its absence of ionizing radiation and its remarkable ability to visualize subtle disease processes. Its high cost, however, tends to limit its use to major medical centers.

A general description of the theory and hardware used in nmr imaging can be obtained from the book entitled *Nuclear Magnetic Resonance Imaging in Medicine,* published in 1981 by Igaku-Shoin, Ltd., Tokyo.

NMR instruments require a very strong main magnetic field, in addition to a variety of smaller gradient fields. The early nmr instruments used resistive electromagnets to produce a main field in order of 0.5 to 1.5 kilogauss. Although these provided interesting images, the signal-to-noise ratio or snr was inadequate for some studies. The limitation on the magnetic field strength is the power dissipation of the resistive magnet. To overcome this problem, superconductive magnets were introduced to supply the main field. Although these provide the required high fields without dissipation problems they are very expensive, critical to operate and consume relatively large amounts of the liquid helium refrigerant. They do, however, provide strong fields of the order of 5.0 kilogauss. Since the snr varies approximately as the square of the magnetic field, these higher fields are very desirable with all nmr imaging modes.

In addition to imaging it is often desired to provide a spectrum representing the material constituents of a small volume in order to study, for example, phosphorus metabolism. These studies, however, require a very strong main field, usually above 10 kilogauss. At these field strengths, however, imaging is very difficult, if not impossible, because of the tissue attenuation. Therefore a single machine, efficiently providing imaging and tissue analysis, cannot operate at a fixed field strength.

The isolation of the single voxel for tissue analysis can be accomplished in a number of ways. One approach is described by E. R. Andrew in a paper entitled, "Nuclear Magnetic Resonance Imaging: The Multiple Sensitive Point Method," *IEEE Transactions on Nuclear Science,* Vol. NS-27, June 1980, pp. 1232–1238. In this system time varying gradients of different frequencies are applied to three orthogonal axes. Therefore all regions, except a small voxel, will be time varying and average out to zero. Therefore the resultant signal is due solely to the voxel of interest. Long integration times must be used to separate the fine lines in the spectrum which represent the metabolism-indicating parameters.

One useful approach is to use the imaging system to identify regions of disease, and then use spectral analysis in small regions to evaluate the nature of the disease. However, this requires both imaging and spectroscopic capability, which requires a magnetic field capable of being changed.

SUMMARY OF THE INVENTION

An object of this invention is to enable resistive electromagnets to operate at high fields without excessive power dissipation.

A further object of this invention is to enable imaging and spectroscopic analysis of a small region to be accomplished with the same instrument.

BRIEF DESCRIPTION OF THE DRAWINGS

For a more complete disclosure of the invention reference may be made to the following description where.

DESCRIPTION OF THE PREFERRED EMBODIMENT

Figure 1:
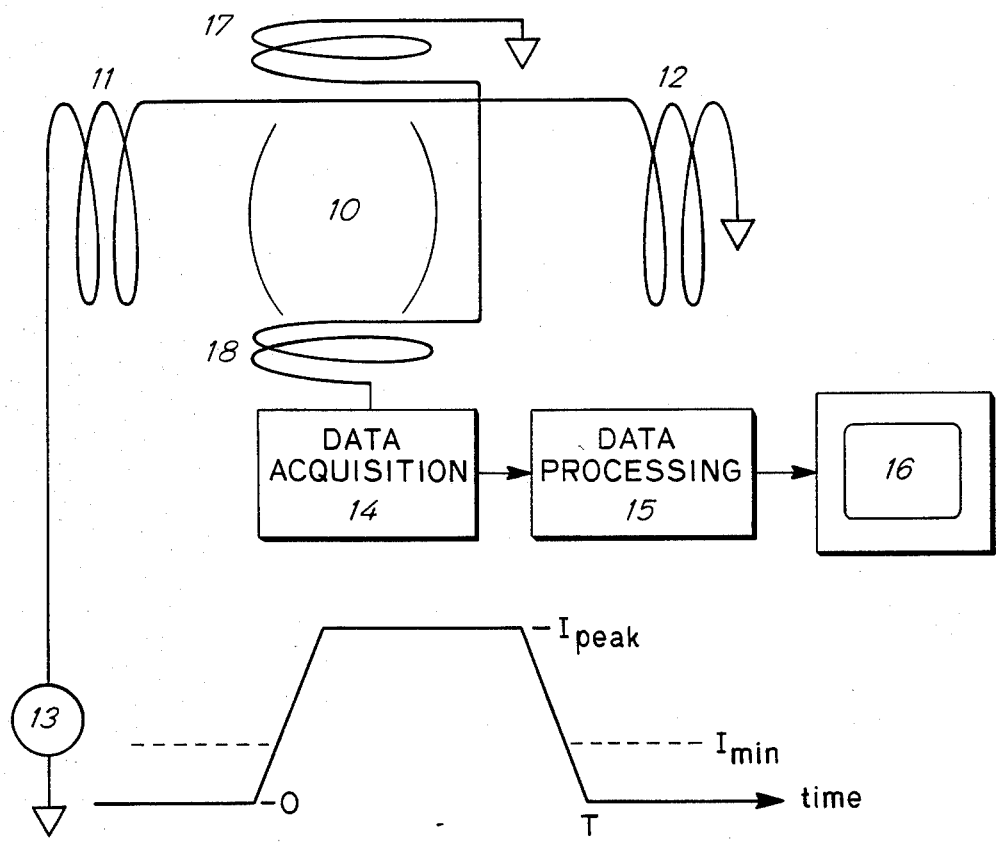
FIG. 1 is a schematic illustrating the invention.

An understanding of the broad aspects of the invention may best be had by reference to FIG. 1. An nmr image is to be made of object 10, usually the human body. The main field coils are usually a series of solenoids providing a relatively uniform field. For illustration we show two series connected solenoids 11 and 12. In conventional systems, these are powered by a d.c. source whose current is limited by the dissipation of the coils themselves.

Here the coils are driven by pulse source 13. During the data acquisition period, corresponding to time interval T, the current is increased to $I_{peak}$ as shown. As long as the time T is small compared to the thermal time constant or thermal inertial of the coil system, the magnet will not reach its final temperature. Instead the temperature will be based on the average power input, rather than the peak power input. Therefore, as long as the duty cycle of the pulses used are relatively low, the peak current $I_{peak}$, and the resultant magnetic field, can be much higher than is conventionally used, so that the desired range of 3.0–5.0 kilogauss can be reached with a relatively inexpensive system.

Since a variety of nmr imaging systems are described in the literature, including the previously referenced book *Nuclear Magnetic Resonance Imaging in Medicine,* they will not be described here in detail. What is generic to all systems, however, are radio frequency coils 17 and 18 which produce a field normal to the main field, for exciting the nuclear spins and receiving the resultant signals. Data acquisition system 14 generically represents the transmitter for the r.f. coils and the receiver of the resultant signals at the appropriate time intervals. These signals are processed by data processing system 15 to provide imaging information about specific regions of object 10. In some embodiments a Fourier transform is taken of the received signal to provide the spatial information. This is then used at each projection in a reconstruction system. The reconstructed image information is displayed in 16.

The data acquisition period T can be defined in many ways. In most imaging systems, as explained in the previously referenced book *Magnetic Resonance Imaging in Medicine,* a series of projections are obtained of the desired region. Each projection involves an excitation pulse sequence of a radio frequency field followed by the reception of a signal from the nuclear spins. On the order of 200 of such projections are taken at about one second intervals, corresponding to a total data acquisition time for the region of interest of about 2–5 minutes, depending on the specific application. The time period T can correspond to this total interval of a few minutes. This time interval is lower than the thermal time constant of most magnets used. In the case of multiple-slice systems which simultaneously acquire all of the sections in this few minute interval, this would be the total time for each patient. Thus the normal time required in changing patients would, of itself, insure the required low duty cycle. In a single slice machine, sufficient time would be allowed between slices to allow the low average, and avoid excess power dissipation.

An alternate approach is to have the time interval T correspond to each projection interval. The excitation and reception periods of each projection are of the order of 10 milliseconds, or about 1% of the one second repetition rate. The pulse could be turned on just during these intervals and be off during the relaxation intervals, to achieve the required low duty cycle. These relatively short pulses, however, require windings with reduced distributed capacity to increase the self-resonant frequency. Also the pulse generator requirements are more difficult.

The pulse waveform in FIG. 1 is shown with rise and fall periods. This is to avoid excessively high voltages across the main windings 11 and 12. The voltages across each coil are given by $$e = L\,di/dt + iR$$

where i is the instantaneous current and L and R are the inductance and resistance of the coil respectively. The peak voltage is therefore reduced by making di/dt, the rate of change of current during the transition, no larger than required. The use of a current pulse with relatively long rise and fall times is not a problem as long as the pulse is full on during the required data acquisition interval.

As it is shown in the dotted portion of the waveform, the pulse needn't be reduced to zero between data acquisition periods. For a number of reasons, it may be preferable to reduce the current to a value $I_{min}$ as shown in FIG. 1. It is required, however, that the resultant continuous power dissipation $I^2_{min}R$, be less than the maximum dissipation of the magnet coils 11 and 12. One reason for the use of $I_{min}$ relates to stability. To minimize dimensional changes in the magnet configuration, which might disturb the uniformity, the use of $I_{min}$ minimizes the temperature changes, thus helping to stabilize the magnet. Another reason for the use of $I_{min}$ relates to imaging time. Since the magnetization disappears in the absence of the main field, it can require additional time to renew the magnetization in the subject being studied. The presence of $I_{min}$ insures a continuing magnetization at some minimal level.

Another approach to insuring that the magnet operates at a fixed stable temperature is to use a repetitive pulsed waveform. Thus pulse 13 in FIG. 1 would repeat at a fixed interval. This would insure a fixed average power and dissipation in the magnet, and still provide the desired high peak field resulting from $I_{peak}$. As before, between pulses the current could go to zero or $I_{min}$. The data acquisition operation is then timed to coincide with the peak current intervals.

To minimize the problem of inaccurate magnetic fields which might occur when using a pulsed source, various monitoring systems can be used. These sample the magnetic field to insure that it is at its correct value. If incorrect, either the current can be changed to make it correct, otherwise the frequencies used in the imaging system can be appropriately altered for the altered magnetic field.

One interesting approach to the monitoring of the magnetic field is described in the British Patent Application G1N 2076542 by Godfrey Hounsfield of EMI, Limited in 1981 entitled, "NMR Imaging Apparatus." Here a set of coils are placed on either side of the object to sense the frequencies produced on either side of the plane of interest. These signals are then used to decode the information within the plane of interest so that any temporal variation in the field is automatically compensated for.

Many variations on this general theme are possible, as long as the pulse duration T is shorter than the time constant and that the integrated average power over a long interval is less than the allowed power dissipation. This long interval is longer than the thermal time constant. This method may be used with any of the data acquisition and processing systems, and is particularly suited to the systems involving short data acquisition intervals such as the echo planar system described by P. Mansfield and I. L. Pykett in "Biological and Medical Imaging by NMR," in the *Journal of Magnetic Resonance,* Vol. 29, pp. 355–373 in 1978.

As previously mentioned, it is desirable for the same machine to be capable of both imaging and spectroscopy of a small volume. This cannot presently be accomplished because the systems use fixed main fields. The superconductive magnets are not capable of change.

Referring to FIG. 1, the system can be first excited for imaging, as previously described, where $I_{peak}$ represents a main field of about 3–5 kilogauss, suitable for imaging. Higher fields result in attenuation and resultant image degradation. The images are examined and pathological regions or lesions are found. To identify these lesions $I_{peak}$ is increased to provide a field of 10–20 kilogauss, again insuring that the average power dissipated is within rating and the time duration T is less than the thermal time constant of the magnet. During this time, as previously indicated, the gradient coils, not shown, are excited by a.c. signals plus a bias such that only the region representing the lesion is not time varying and produces an output signal. This signal is Fourier transformed by Data Processor 15 with the spectrum displayed on display 16. This spectrum indicates the nature of the lesion, such as distinguishing a benign from a malignant tumor.

What is claimed is:

1. In a method for imaging a region of the body using nuclear magnetic resonance where the main magnet has a controllable field amplitude the steps of:
    applying gradient fields;
    increasing the amplitude of the main magnetic field during the image data acquisition time interval including the excitation and reception intervals for a time shorter than the thermal time constant of the main magnet;
    decreasing the amplitude of the main magnetic field during times that image data is not being acquired; and
    processing the nuclear magnetic resonance signals to provide spatial information for creating an image.

2. Apparatus for producing nuclear magnetic images of a region of the body comprising:
    an electromagnet sufficiently large to encompass the human body for providing the main field of the imaging system;
    means for applying gradient fields;

data acquisition means for acquiring nmr imaging data;

data processing means for processing the nmr data to produce an image; and means for controlling the amplitude of the main magnetic field where it is increased during the time data is acquired including the excitation and reception intervals, for a time shorter than the thermal time constant of the electromagnet, and decreased during times that image data is not being acquired whereby the signal-to-noise ratio is improved.

3. Apparatus as recited in claim 2 where the field is turned off during times that image data is not being acquired.

4. Apparatus as recited in claim 2 where the field is reduced, during times that image data is not being acquired, to a value which results in an average power dissipation in the electromagnet below that of the maximum dissipation allowed.

5. Apparatus as recited in claim 2 where the time that the main magnetic field is at the increased level corresponds to the time required to collect all of the imaging data for the region.

6. Apparatus as recited in claim 2 where the time that the main magnetic field is at the increased level corresponds to the time of acquiring data for a single projection interval including both excitation and reception intervals.

7. Apparatus as recited in claim 2 where the rate of change of the increasing and decreasing magnetic field is limited to a value which prevents excess voltage from appearing across the electromagnet and causing breakdown.

8. Apparatus as recited in claim 2 further comprising:
means for increasing the magnetic field to a value higher than that used to collect imaging data;
means for acquiring nmr data from a subregion substantially smaller than the region being imaged; and
means for processing the nmr data from the subregion using spectral analysis to characterize the subregion.

9. Apparatus as recited in claim 2 wherein the means for controlling the amplitude of the main magnetic field includes means for periodically increasing the field at a fixed repetition rate.

10. In a method for characterizing the tissue of a subregion of a region of the body being imaged using nuclear magnetic resonance the steps of:
pulsing the main magnetic field to a first value during the image data acquisition time including both excitation and reception intervals having a duration shorter than the thermal time constant of the main magnet;
applying gradient fields;
acquiring and processing image data from the region;
pulsing the main magnetic field to a second value which is higher than the first value for a time shorter than the thermal time constant of the main magnet;
acquiring nmr signals from the subregion; and
spectrally analyzing the signals from the subregion.

11. In a method for imaging a region using nuclear magnetic resonance where the main magnet can contain the human body and has a controllable field amplitude the steps of:
applying gradient fields;
increasing the amplitude of the main magnetic field during the acquisition of a complete set of image data for reconstructing an image for a time shorter than the thermal time constant of the main magnet;
decreasing the amplitude of the main magnetic field outside of this acquisition time; and
processing the resultant signals to provide an image of a region of the body.

12. In a method for increasing the signal-to-noise ratio of an nmr system where the main magnet can contain the human body and has a controllable field amplitude the steps of:
applying gradient fields;
increasing the amplitude of the main magnetic field during at least the times of excitation of the body and reception of signals;
decreasing the amplitude of the main magnetic field outside of the excitation and reception times; and
processing the signals to provide an image of improved signal-to-noise ratio.

* * * * *